United States Patent
Huang et al.

(10) Patent No.: US 6,342,792 B1
(45) Date of Patent: Jan. 29, 2002

(54) LOGIC MODULE CIRCUITRY FOR PROGRAMMABLE LOGIC DEVICES

(75) Inventors: Wei-Jen Huang, Burlingame; Sergey Shumarayev, San Leandro; Tony Ngai, Campbell; Bruce Pedersen, San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/518,009

(22) Filed: Mar. 2, 2000

Related U.S. Application Data

(60) Provisional application No. 60/122,788, filed on Mar. 4, 1999, and provisional application No. 60/142,431, filed on Jul. 6, 1999.

(51) Int. Cl.[7] .............................................. G06F 7/38
(52) U.S. Cl. .............................. 326/40; 326/39; 326/41
(58) Field of Search ............................. 326/38, 39, 40, 326/41

(56) References Cited

U.S. PATENT DOCUMENTS

| | | | |
|---|---|---|---|
| 3,473,160 A | 10/1969 | Wahlstrom | 340/172.5 |
| RE34,363 E | 8/1993 | Freeman | 307/465 |
| 5,241,224 A | 8/1993 | Pedersen et al. | 307/465 |
| 5,371,422 A | 12/1994 | Patel et al. | 326/41 |
| 5,414,377 A | * 5/1995 | Freidin | 326/41 |
| 5,432,719 A | * 7/1995 | Freeman et al. | 364/579 |
| 5,689,195 A | 11/1997 | Cliff et al. | 326/41 |
| 5,909,126 A | 6/1999 | Cliff et al. | 326/41 |
| 5,999,015 A | * 12/1999 | Cliff et al. | 326/39 |

OTHER PUBLICATIONS

*Device Data Book*, 1999, Altera Corporation, San Jose, California, pp. 25–88 ("Apex 20K Programmable Logic Device Family", May 1999, ver. 2); pp. 89–345 ("Flex 10K Embedded Programmable Logic Family Data Sheet", May 1999, and "Flex 10KE Embedded Programmable Logic Family Data Sheet", May 1999, ver. 2); and pp. 347–410 ("Flex 8000 Programmable Logic Device Family Data Sheet", May 1999).

"Virtex–E 1.8 V Field Programmable Gate Arrays," DS022 (v 1.3) Feb. 29, 2000, Advance Product Specification, Xilinx, Inc., San Jose, California, pp. 1–190.

"Virtex 2.5 V Field Programmable Gate Arrays," DS003 (v 2.0) Mar. 9, 2000, Preliminary Product Specification, Xilinx, Inc., San Jose, California, pp. 1–72.

\* cited by examiner

*Primary Examiner*—Michael Tokar
*Assistant Examiner*—Anh Tran
(74) *Attorney, Agent, or Firm*—Fish & Neave; Robert R. Jackson; Andrew Van Court

(57) ABSTRACT

A programmable logic integrated circuit device has logic modules with some inputs that are optimized for speed (to enhance the speed-performance of the logic modules). For example, some of the inputs may be programmably swappable within a logic module so that a speed-critical input signal can be more easily routed to a faster part of the logic module circuitry. Alternatively or in addition, drivers may be added to the logic module circuitry to improve the speed performance of some of the inputs to the logic module. The logic module may be provided with enhanced "lonely register" circuitry which allows the lonely register output signal to be fed back for use as an input to the combinatorial logic of the logic module. The registers in multiple logic modules may be directly chained to one another in a series.

47 Claims, 5 Drawing Sheets

LOGIC MODULE CIRCUITRY FOR PROGRAMMABLE LOGIC DEVICES

This application claims the benefit of U.S. provisional patent application No. 60/122,788, filed Mar. 4, 1999, and U.S. provisional patent application No. 60/142,431, filed Jul. 6, 1999, both of which are hereby incorporated by reference herein in their entireties.

BACKGROUND OF THE INVENTION

This invention relates to programmable logic integrated circuit devices ("PLDs"), and more particularly to improved circuitry for the logic modules of such devices.

Programmable logic devices typically include (1) many modules of programmable logic, and (2) programmable interconnection resources for selectively conveying signals to, from, and/or between those logic modules. Each logic module is programmable to perform any of several different, relatively simple logic functions on input signals applied to that logic module to produce one or more logic module output signals. For example, a logic module may include combinatorial logic circuitry such as a look-up table that is programmable to produce a first intermediate signal that is any logical combination of several input signals applied to the logic module. The logic module may also include a register that is capable of registering the first intermediate signal to produce a second intermediate signal. The logic module may still further include programmable logic connector ("PLC") circuitry that is programmable to select one or more logic module output signals from the first and second intermediate signals of the logic module. Although each logic module may thus be able to perform only a relatively small logic task, the interconnection resources of the PLD allow any number of the available logic modules to work together to perform very complex logic tasks.

Examples of known PLDs are shown in Wahlstrom U.S. Pat. No. 3,473,160, Freeman U.S. Pat. No. Re. 34,363, Cliff et al. U.S. Pat. No. 5,689,195, Cliff et al. U.S. Pat. No. 5,909,126, and Jefferson et al. U.S. Pat. Ser. No. 6,215,326, all of which are hereby incorporated by reference herein in their entireties.

In some PLD designs the logic modules can respond more rapidly to some of their input signals than to others of those signals. If that is the case, then it is advantageous to apply signals that are available relatively early in an operating cycle of the PLD to the logic module inputs to which the logic module responds more slowly, and to apply signals that are only available later in the operating cycle to the logic module inputs to which the logic module responds more rapidly. Some PLDs have interconnection resources that allow any signal in those resources to be applied to any input of a logic module so that relatively fast (i.e., early) and relatively slow (i.e., late) signals can be appropriately routed to the slow and fast inputs, respectively, of each logic module. To speed up signal propagation through interconnection resources, however, it may be desirable to make those resources somewhat less flexible with regard to possible signal routings (e.g., to reduce the number of PLCs that are connected to various interconnection conductors and to thereby reduce the loading on those conductors). While this has the benefit of speeding up the interconnection resources, it may make it more difficult or even impossible in some cases to route fast and slow signals, respectively, to the slow and fast inputs of various logic modules. This in turn makes the speed characteristics of the logic modules even more critical to the overall speed performance of the PLD.

In addition to the foregoing, enhancements to the capabilities of logic modules are always being sought. For example, it is known to allow one of the inputs to a logic module to be selectively applied to the register of the logic module in lieu of the first intermediate signal from the combinatorial logic circuitry of the module. This is sometimes known as "lonely register mode" operation of the logic module. This type of operation tends to separate the two parts of the logic module (i.e., the combinatorial logic circuitry and the register) from one another from a logical or operational standpoint, and it would be desirable to tie those two parts together more closely in lonely register mode. It would also be desirable to facilitate the interconnection of the registers in several logic modules in a series (e.g., to facilitate the provision of shift-register-type capabilities), without making the combinatorial logic of those logic modules unavailable for other uses.

In view of the foregoing, it is an object of this invention to provide improved logic module circuitry for PLDs.

It is a more particular object of the invention to provide logic module circuitry for PLDs that can be made to operate more rapidly and that is less dependent on possible differences in input signal timing for such rapid operation.

It is still another object of the invention to provide logic module circuitry for PLDs that enhances lonely register mode operation of the logic module and/or that facilitates connecting the registers of multiple logic modules in series in the manner of a shift register.

SUMMARY OF THE INVENTION

These and other objects of the invention are accomplished in accordance with the principles of the invention by providing logic module circuitry for PLDs that may include the capability of swapping at least some of the input signals applied to the logic module. The input signals that can thus be swapped by a logic module are preferably among those for which swapping by the interconnection resources that supply signals to the logic module would be difficult or impossible. The input signals that can thus be swapped are also preferably among the signals that the logic module is capable of processing most rapidly. These are the signals that can be the most critical to rapid operation of the logic module, and so it is of the greatest benefit to have the greatest flexibility with regard to how these signals are routed.

As an alternative or addition to the abovementioned signal swapping capability, additional drivers may be included at relatively downstream points in the circuitry of a logic module to increase the operating speed of the logic module and in some embodiments to also effectively increase the number of logic module inputs that the logic module can process at relatively high speed. This also helps to reduce the sensitivity of the logic module to inflexibilities in the signal routing capabilities of the associated interconnection resources.

As still other alternatives or additions to the foregoing, each logic module may include programmable circuitry for allowing one of the input signals to the logic module to be applied substantially directly to the register in that logic module in lieu of the output signal of the combinatorial logic circuitry of that logic module, and also for allowing the output signal of the register to take the place of the just-mentioned one input signal as one of the inputs to the combinatorial logic circuitry. This significantly enhances "lonely register mode" operation of the logic module. Interconnections may also be provided between logic modules for allowing the output signal of the register in each logic module to be applied substantially directly to the register in another register in a shift-register-type arrangement of the registers which does not preclude use of the associated combinatorial logic circuitry for other purposes.

Further features of the invention, its nature and various advantages will be more apparent from the accompanying drawings and the following detailed description of the preferred embodiments.

DETAILED DESCRIPTION OF THE PREFERRED EMBODIMENTS

The logic module features of this invention were developed in connection with the development of PLDs of the type shown in commonly assigned, co-pending, U.S. patent application Ser. No. 09/516,921, filed Mar. 2, 2000, which is hereby incorporated by reference herein in its entirety. In the interest of focusing the present specification on the present invention, many elements that are shown in the last-mentioned reference are shown more simply and/or described more briefly herein. However, to the greatest extent possible, the same reference numbers are used herein and in the last-mentioned reference for elements that are the same or similar. Thus more information about illustrative PLD contexts for the present invention can be readily obtained from the last-mentioned reference if desired. (The circuitry referred to as a "logic module" herein is generally referred to as a "subregion" in the last-mentioned reference.) It will be understood that the present invention is equally suitable for use in many other PLD contexts and that it is thus not limited to use in PLD designs of the types shown in the last-mentioned reference.

Figure 1:
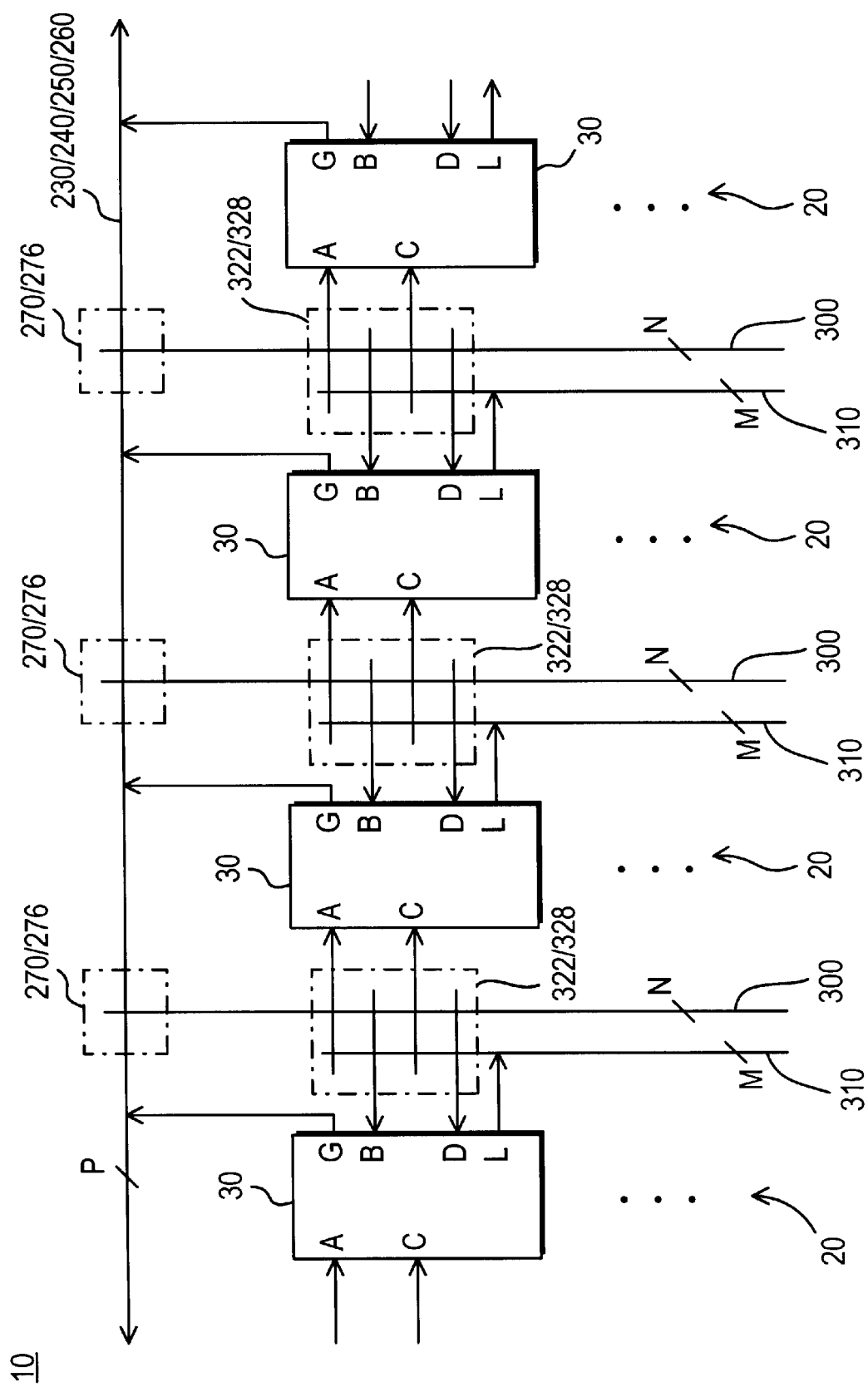
FIG. 1 is a simplified schematic block diagram of a representative portion of an illustrative embodiment of a PLD which can be constructed in accordance with the invention.

FIG. 1 shows several representative logic modules 30 in one representative row of programmable logic on an illustrative PLD 10. Each of the depicted logic modules 30 may be one representative logic module (e.g., the top-most module) in a vertical cluster of such modules, which clusters are referred to herein as logic regions 20. For example, there may be ten similar logic modules 30 in each logic region 20.

A plurality of interconnection conductors 230/240/250/260 is associated with each row of logic regions 20 for conveying signals to, from, and/or between the logic regions in that row. As described in the last-mentioned reference, these conductors may be of several different types, which accounts for the compound reference number used herein.

A plurality of region-feeding conductors 300 is interleaved between each horizontally adjacent pair of logic regions 20. Also interleaved between each horizontally adjacent pair of logic regions 20 is a plurality of local feedback conductors 310. Conductors 300 are provided to bring signals from conductors 230/240/250/260 to the logic modules 30 adjacent to those conductors. Conductors 310 are provided to convey signals between the logic modules 30 that are adjacent to them.

Programmable logic connectors ("PLCs") 270/276 (controlled by programmable function control elements ("FCEs") that are not shown separately in FIG. 1) are provided for programmably selectively applying signals from certain ones of conductors 230/240/250/260 to each of conductors 300. PLCs 322/328 (also controlled by FCEs that are not shown separately) are provided for programmably selectively applying signals from conductors 300/310 to the four main data signal inputs A–D of the adjacent logic modules 30. (It should be noted that in the depicted embodiment each logic module 30 has two of its inputs A–D reachable from the conductors 300/310 on one side of the logic module and the other two of its inputs reachable from the conductors 300/310 on the other side of the logic module.)

In the embodiment being discussed each cluster of PLCs 322/328 is preferably fully populated with all possible interconnections between the associated conductors 300/310 and the logic module inputs A–D served by those conductors and PLCs. On the other hand, each group of PLCs 270/276 is not similarly fully populated. Instead, only about 50% of conductors 230/240/250/260 are connectable to a conductor 300 served by each group of PLCs 270/276. However, each conductor 230/240/250/260 that is not connectable to a conductor group 300 via one group of PLCs 270/276 is preferably connectable to a conductor 300 served by each of the groups of PLCs 270/276 to the left and right of the first-mentioned PLC group. Thus if a signal on a conductor 230/240/250/260 cannot get into a logic module 30 via the conductors 300 on one side of that logic module, it can get into the logic module via the conductors 300 on the other side of that logic module.

The above-described somewhat limited population of possible interconnections in each of PLC groups 270/276 is desirable from the standpoint of holding down the loading on conductors 230/240/250/260. Reduced loading helps to speed up signal propagation on those conductors. In the absence of the present invention, however, the fact that a signal from a conductor 230/240/250/260 may only be able to reach the A or C input of a logic module 30, but not the B or D input of that module (or vice versa), may have an adverse impact on the speed at which the logic module can operate to produce the desired output signal(s) (e.g., the GLOBAL ("G") output signal selectively applied to one or more of the adjacent conductors 230/240/250/260 or the LOCAL ("L") output signal applied to an associated conductor 310). The reasons for this will be apparent from the following further discussion.

Figure 2:
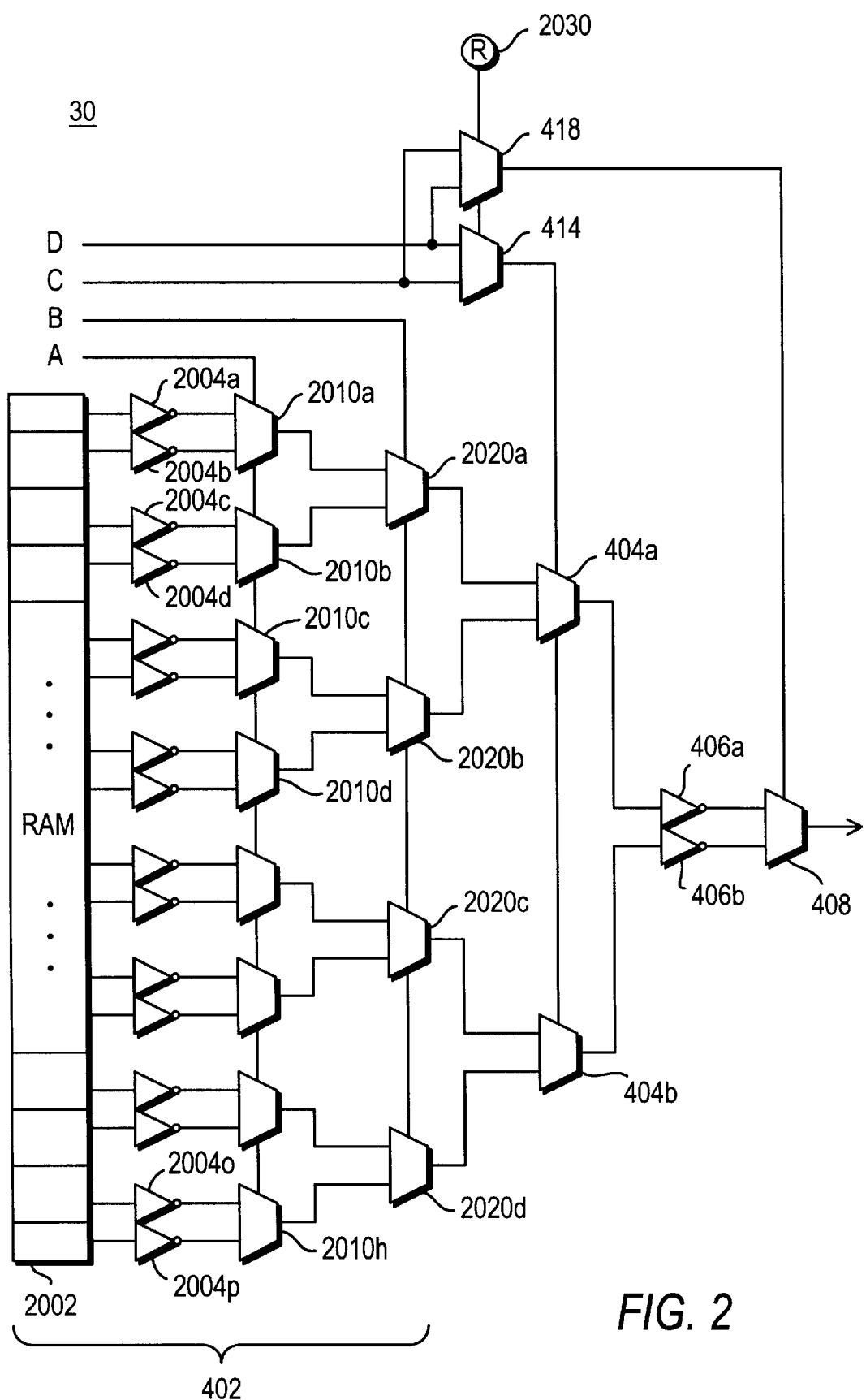
FIG. 2 is a simplified schematic block diagram of an illustrative embodiment of a representative portion of the FIG. 1 circuitry in accordance with the invention.

FIG. 2 shows an illustrative construction of the combinatorial logic portion of a typical logic module 30 in accordance with this invention. The corresponding portion of the last-mentioned reference is FIG. 5A. FIG. 2 herein shows some details that are not shown in FIG. 5A of the last-mentioned reference, and reference numbers in the 2000 series are used for those details herein. On the other hand, some details shown in FIG. 5A of the last-mentioned reference are not repeated in present FIG. 2 because those details are not germane to the present invention. It will be understood, however, that those details can be added to the FIG. 2 circuitry if desired.

The combinatorial logic shown in FIG. 2 is essentially a four-input look-up table. During programming of the PLD (i.e., prior to normal logic operation), 16 bits of data are respectively stored in 16 memory locations in RAM (random access memory) 2002. Each of these memory locations outputs its data via a respective one of inverting buffers 2004a–p. (Buffers are also sometimes referred to as drivers herein.) The output signals of buffers 2004 are applied in a plurality of mutually exclusive pairs to the input terminals of PLCs 2010a–h, one of which PLCs is respectively associated with each of the pairs of buffer 2004 output signals. Each of PLCs 2010 is controlled by the A input signal of the logic module to select one of its two inputs for application to its output terminal. (Although referred to for convenience herein as PLCs, elements like 2010 are dynamically rather than programmably controlled. In other words, the control signals for elements like 2010 are logic signals that can change in value during normal logic operation of device 10. In this respect elements like 2010 are different from PLCs 270/276, which are typically programmably controlled by FCEs to always make the same connections after programming. Structurally, however, elements like 2010 may be similar to elements like 270/276, and so they are referred to for convenience as PLCs. Other elements like 2010 that are dynamically controlled but that are referred to as PLCs are elements 2020, 404, and 408.) The output signals of PLCs 2010 are applied in a plurality of mutually exclusive pairs to the input terminals of PLCs 2020a–d, one of the latter PLCs being respectively associated with each of the pairs of PLC 2010 output signals. Each of PLCs 2020 is controlled by the B input signal of the logic module to select one of its two inputs for application to its output terminal.

The output signals of PLCs 2020 are applied in a plurality of mutually exclusive pairs (i.e., two mutually exclusive pairs) to the input terminals of PLCs 404a–b, one of the latter PLCs being respectively associated with each of the pairs of PLC 2020 output signals. PLC 414 is programmably controlled by FCE 2030 to select either logic module input signal C or logic module input signal D as the signal applied to the control input terminals of PLCs 404. The signal applied to the control input terminals of PLCs 404 determines which applied data input signals each of those PLCs applies to its output terminal.

The output signals of PLCs 404 are applied to the data input terminals of PLC 408 via inverting buffers 406a–b. PLC 418 is programmably controlled by FCE 2030 to select the one of logic module inputs C and D that is not selected by PLC 414 for application to the control input terminal of PLC 408. Thus, for example, if PLC 414 selects input C for application to PLCs 404, PLC 418 selects input D for application to PLC 408. Alternatively, if PLC 414 selects input D for application to PLCs 404, PLC 418 selects input C for application to PLC 408. (Although FIG. 2 shows a single FCE 2030 controlling both of PLCs 414 and 418, it will be understood that separate FCEs can be provided for PLCs 414 and 418 if desired.) The signal applied to the control input terminal of PLC 408 determines which of the applied data signals that PLC applies to its output terminal. The output signal of PLC 408 is the combinatorial intermediate signal of logic module 30. Although not shown in FIG. 2, this combinatorial signal is typically applied to a register in the logic module (see FIG. 4). The register registers the combinatorial signal to produce a second intermediate signal. Further PLCs are included in the logic module to select either the combinatorial or registered signal as any of several output signals of the logic module (e.g., the G and/or L output signals shown in FIG. 1).

From the foregoing it will be appreciated that the combinatorial circuitry shown in FIG. 2 is programmable (via programming of RAM 2002) to provide an output signal from PLC 408 that is any logical combination of logic module inputs A–D. It will also be appreciated that if inputs A–D may arrive at different times during an operating time interval of the PLD (e.g., a clock cycle associated with the PLD), the FIG. 2 circuitry can respond most quickly if the later-arriving input signals are applied to the control input terminals of the relatively downstream PLCs in the sequence or series 2010, 2020, 404, 408. Another way in which this may be said is that the FIG. 2 circuitry can respond most quickly if the last-to-arrive input signal is applied to the control input terminal of PLC 408. If the last-to-arrive input signal is handled in this way, the earlier-arriving input signals will already have made their selections from the data in RAM 2002 and the results of those selections will have been buffered by buffers 406 and be ready at the input terminals of PLC 408. Then when the last-to-arrive input signal is applied to the control input terminal of PLC 408, that component can immediately select and output the final combinational output signal.

Because of the above-described economy in the connections available in PLC groups 270/276, as well as the fact that some inputs to a logic module 30 can come only from one side of the logic module while other inputs can come only from the other side of the logic module (see FIG. 1), it may not be possible to route the most time-critical (i.e., the last-to-arrive) input signal to a particular input A–D of a logic module. Accordingly, PLCs 414 and 418 are provided in each logic module in accordance with this invention to allow the C and D inputs to be effectively swapped with one another within the logic module. Thus if the last-to-arrive input signal can only be routed to input C, PLC 418 can route that input to the control input terminal of PLC 408. Or if the last-to-arrive input signal can only be routed to input D, PLC 418 can route that input to the control input terminal of PLC 408. In this way either input C or input D can be used to receive the last-to-arrive signal, and this greatly eases routing constraints that might otherwise prevent the device from realizing maximum logic module operating speed.

The provision of buffers 406 upstream from PLC 408 also improves performance of the logic module when the last-to-arrive input signal is used to control PLC 408. The signals from which PLC 408 will make the final selection have already been buffered. Thus no further buffering (and consequent delay) is needed downstream from PLC 408. When PLC 408 makes its selection, an adequately buffered combinatorial signal is immediately available at the output terminal of that PLC.

Another advantage of giving logic modules 30 the ability to swap two inputs (C and D) that come from opposite sides of the logic module in an architecture that employs region-feeding conductors 300 that are interleaved between horizontally adjacent logic modules is as follows: A time-critical signal that is needed by logic modules 30 on both sides of a region-feeding conductor 300 can be supplied to just that one region-feeding conductor. The logic module 30 to the left of that conductor 300 can take in the time-critical signal via its D input terminal and route that signal via PLC 418 to PLC 408. The logic module 30 to the right of that conductor 300 can take in the time-critical signal via its C input and route that signal to PLC 408 via PLC 418. If only the D input terminal of a logic module could be used for the most time-critical input signal, it might be necessary to route such a signal via two region-feeding conductors 300 to reach two horizontally adjacent logic modules 30 requiring that signal as an input.

In addition to the above-mentioned advantage of speeding up the C/D inputs, the inclusion of drivers 406 has the following benefits: (1) lower total load for the PLC 408 control signal, (2) reduction in the required size of drivers 2004, with consequent area savings, and (3) series resistance reduction from PLCs 2010 through PLCs 2020 and 404, allowing both size reduction (area savings) and speed-up to A and B inputs.

Figure 3:
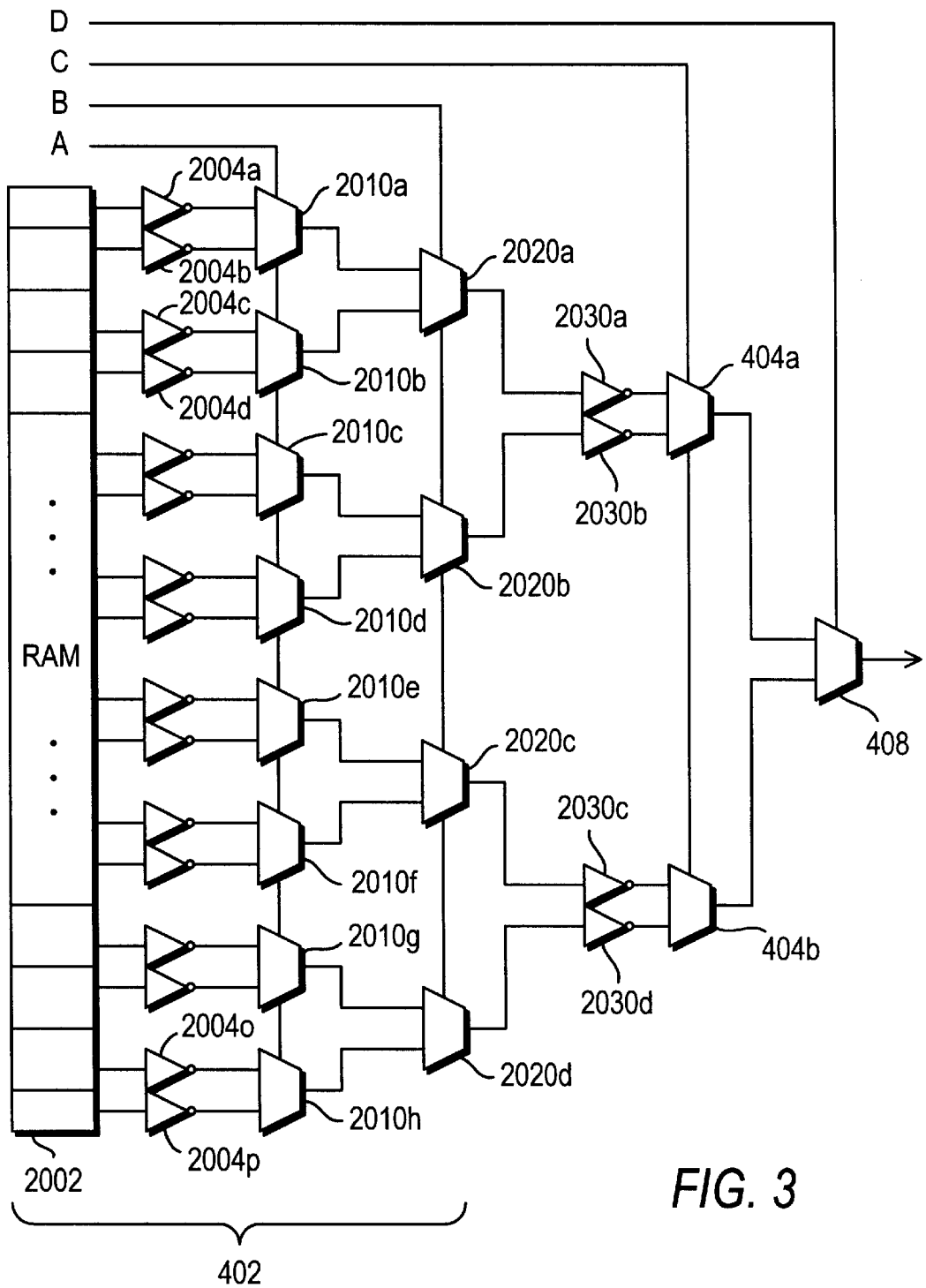
FIG. 3 is a simplified schematic block diagram showing an alternative embodiment of the FIG. 2 circuitry in accordance with the invention.

FIG. 3 shows an alternative embodiment in which buffers 2030a–d are provided intermediate the PLCs 2020 that make the selection based on input B and the PLCs 404 that make the selection based on input C. In this alternative PLCs 414 and 418 are omitted, as are buffers 406. The FIG. 3 embodiment makes both of inputs C and D fast and therefore suitable for time-critical input signals to a logic module 30 for the same reasons (described above) that buffers 406 in FIG. 2 help to increase the speed performance of a logic module in response to the signal applied to the control input terminal of PLC 408 in that FIG. Because the FIG. 3 embodiment makes both of inputs C and D suitable for time-critical input signals, the signal-swapping PLCs 414 and 418 of FIG. 2 may not be needed in FIG. 3. A time-critical signal can be applied to a region-feeding conductor 300 between two horizontally adjacent logic modules 30 and taken into the logic module on the left via the D input terminal of that logic module and into the logic module on the right via the C input terminal of that logic module. There will be some skew (i.e., difference in speed performance) between the two logic modules because the D input will be somewhat faster than the C input. However this skew will be less than it would be in the absence of the drive from buffers 2030 immediately upstream from the PLCs 404 that are controlled by the C input.

Figure 4:
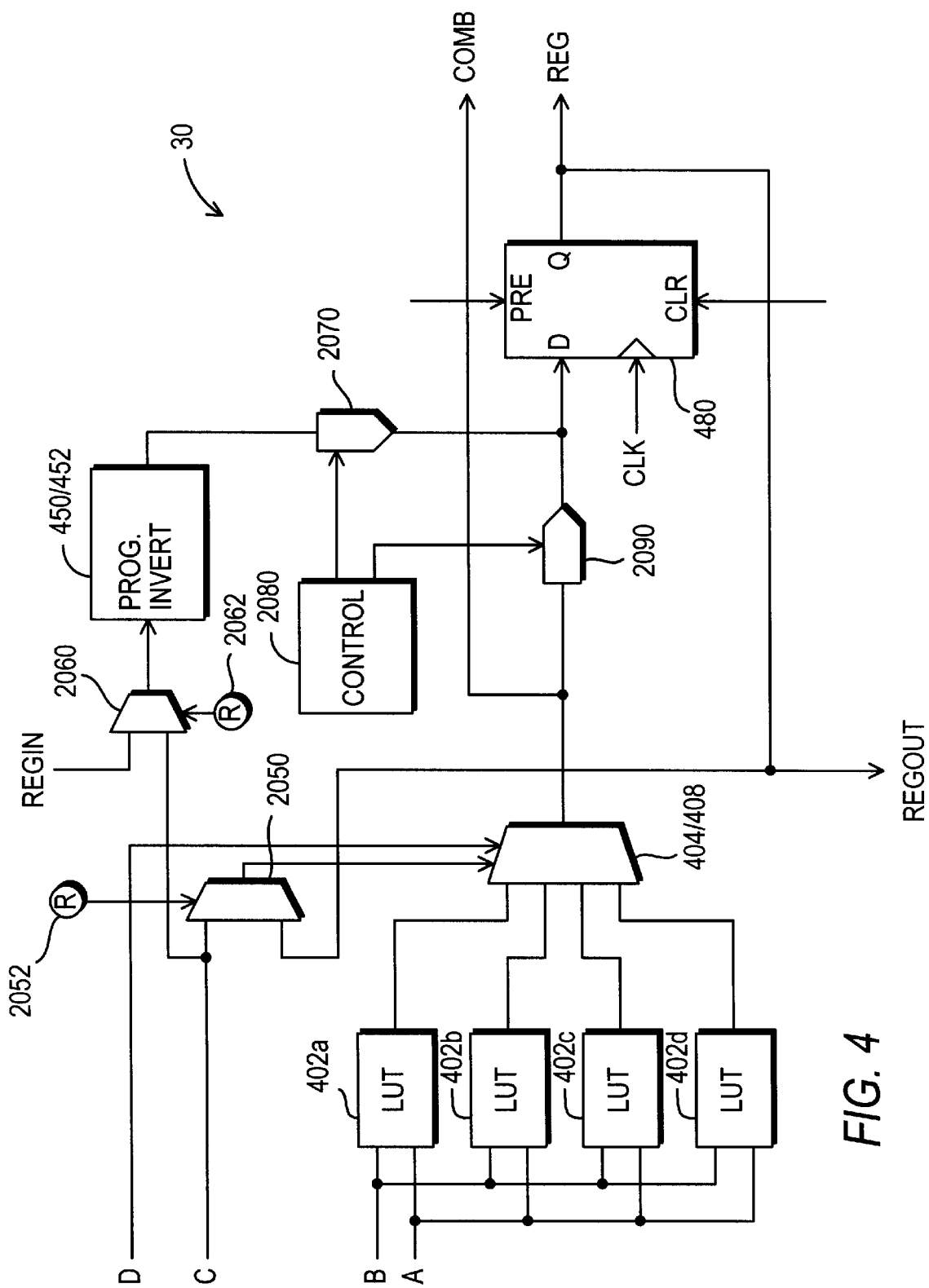
FIG. 4 is a simplified schematic block diagram of an illustrative embodiment of another representative portion of the FIG. 1 circuitry in accordance with other aspects of the invention.

FIG. 4 shows additional features that may be included in logic modules 30 in accordance with other aspects of this invention. To more clearly bring out these aspects of the invention, FIG. 4 has been greatly simplified as compared to FIGS. 5A and 5B in the last-mentioned reference. Again, however, elements from those FIGS. that are repeated in FIG. 4 have the same reference numbers in both sets of drawings. Elements in FIG. 4 that have no counterparts (or at least no direct counterparts) in FIGS. 5A and 5B in the last-mentioned reference have reference numbers in the 2000 series in FIG. 4.

As was mentioned earlier, each logic module 30 includes combinatorial logic circuitry (basically elements 402, 404, and 408 in FIG. 4) and register circuitry (basically element 480 in FIG. 4). In FIG. 4 the combinatorial logic circuitry is shown as four two-input look-up tables 402a–d, each of which is programmable to produce an output signal which is any logical combination of the A and B inputs to the logic module. Inputs C and D can be used to control PLC 404/408 to select any one of the four two-input look-up table output signals as the final combinatorial output signal. This signal can be one or more of the output signals of the logic module (via lead COMB). It can also be applied to the D input terminal of register 480 via pass gate 2090. Register 480 registers the signal applied to its D input terminal and provides the registered signal at its Q output terminal. This signal can also be one or more of the output signals of the logic module (via lead REG).

If register 480 is not needed to register the output signal of PLC 404/408, the register is not necessarily wasted. It can instead be used in so-called "lonely register mode" to register the C input to the logic module. For this purpose the C input signal is applied to one input terminal of PLC 2060, which is programmably controlled by FCE 2062 to select either one of its two input signals for application to programmable invert circuitry 450/452. This circuitry is programmable to either invert or not invert the applied signal for application to pass gate 2070. When lonely register mode is desired, control circuitry 2080 (which is at least partly programmable by FCEs that are not shown separately) disables pass gate 2090 and enables pass gate 2070 instead. Accordingly, the output signal of programmable invert circuitry 450/452 is applied to register 480 in lieu of the combinatorial output signal from PLC 404/408, and the output signal of the register is therefore the registered C input signal (in true or complement form, depending on how circuitry 450/452 is programmed to operate).

Lonely register mode, per se and without programmable invert circuitry 450/452, is known in the art. In accordance with this invention, however, the lonely register mode feature is enhanced by feedback circuitry from the Q output of register 480 through PLC 2050 to what is normally the C control input of PLC 404/408. PLC 2050 is programmably controlled by FCE 2052 to apply either the C input to the logic module or the Q output of register 480 to the C control input of PLC 404/408. Accordingly, the C input to the logic module can be used in any of several different ways. It can be used as one of the control inputs to PLC 404/408. Alternatively or in addition it can be used as the lonely register input signal. If used as the lonely register input signal, then after registration by register 480 it can be used as one of the control inputs to PLC 404/408 (PLC 2050 programmed to apply the Q output of register 480 (rather than the unregistered C input) to PLC 404/408). This last-mentioned possible use of the C input signal enables lonely register operation to be combined in one logic module 30 with any four-input combinatorial function that makes use of the lonely register output signal. In this way the lonely register does not necessarily or completely "steal" the C input to the combinatorial logic circuitry of the logic module. The lonely register mode can be used to make it appear that the C input feeds a register. In effect, this type of operation enables "re-timing" of the C input signal (e.g., delaying it by one clock cycle). (Note that if it is desired to use the C input to the logic module exclusively as a lonely register input and without making use of lonely register feedback through PLC 2050, the RAM cells of look-up tables 402a–d (e.g., RAM 2002 in FIG. 2 or 3) can be programmed so that it does not matter what logical value the output signal of PLC 2050 has.)

FIG. 4 also shows another possible logic module feature in accordance with this invention. In addition to its other possible uses, the output signal of the register 480 in each logic module is applied via the REGOUT lead of that module to the REGIN lead of another adjacent or nearby logic module. The REGIN signal of each logic module is the second input to the PLC 2060 in that logic module. PLC 2060 can be programmably controlled by FCE 2062 to apply the REGIN signal to programmable invert circuitry 450/452. As has already been described, pass gate 2070 can be enabled by control circuitry 2080 to apply the output signal of circuitry 450/452 to the D input terminal of register 480. This signal routing allows the registers 480 in any number of logic modules 30 to be connected in a chain or series in which the input of each register is fed directly by the output of the preceding register in the series. Possible uses of such register chains are to create long shift registers or to add register pipelining registers that are completely buried (i.e., no general interconnection resources are consumed and the combinatorial logic of the logic modules involved remains fully available for other uses).

Figure 5:
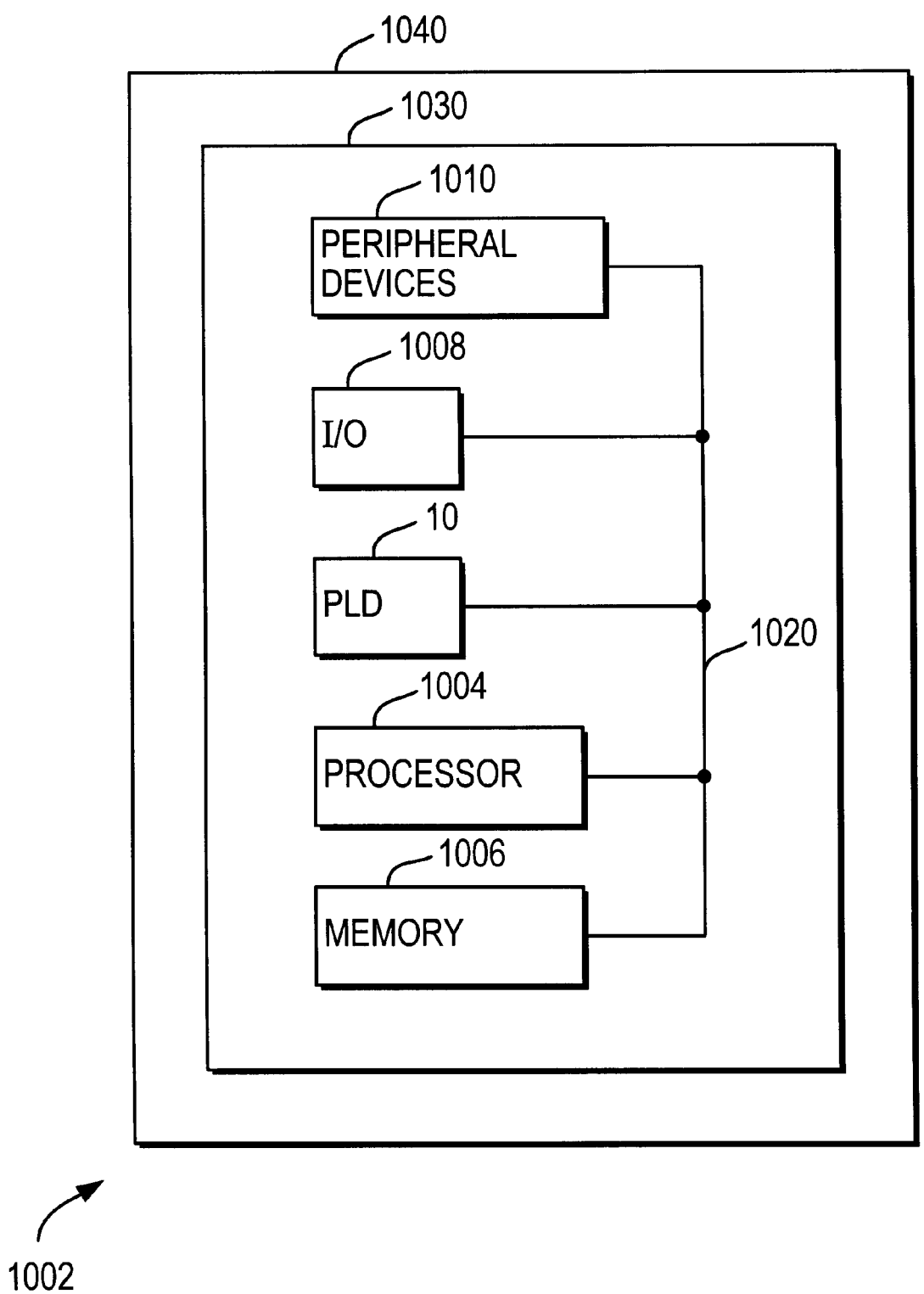
FIG. 5 is a simplified block diagram of an illustrative system employing a programmable logic device in accordance with the invention.

FIG. 5 illustrates a programmable logic device 10 of this invention in a data processing system 1002. Data processing system 1002 may include one or more of the following components: a processor 1004; memory 1006; I/O circuitry 1008; and peripheral devices 1010. These components are coupled together by a system bus 1020 and are populated on a circuit board 1030 which is contained in an end-user system 1040.

System 1002 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 1004. Programmable logic device 10 may also be used as an arbiter for arbitrating access to a shared resource in system 1002. In yet another example, programmable logic device 10 can be configured as an interface between processor 1004 and one of the other components in system 1002. It should be noted that system 1002 is only exemplary, and that the true scope and spirit of the invention should be indicated by the following claims.

Various technologies can be used to implement programmable logic devices 10 having the features of this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the forgoing is only illustrative of the principles of this invention, and that various modifications can be made by those skilled in the art without departing from the scope and spirit of the invention. For example, the numbers of the various types of resources on device 10 can be different from the numbers present in the depicted and described illustrative embodiments. This applies to such parameters as the numbers of rows and columns of the various types of circuitry, the number of subregions 30 in each region 20, the numbers of the various types of interconnection conductors, the numbers and sizes of the PLCs provided for making interconnections between various types of interconnection conductors, etc. It will also be understood that various directional and orientational terms such as "vertical" and "horizontal," "left" and "right," "above" and "below," "row" and "column," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Terms like "region" and "subregion" (or "logic module") are also used only as generic, relative terms, and other terms may be used for generally similar circuitry. Indeed, these terms may be used interchangeably herein in contexts in which a region/subregion hierarchy is not important. Alternatively, devices within the scope of this invention may have regions of programmable logic that are not divided into subregions. Although look-up table logic is employed in the illustrative embodiments shown and described herein, it will be understood that in connection with at least some aspects of the invention other types of logic may be used instead if desired. For example, sum-of-products logic, such as is the primary example considered in references like Pederson et al. U.S. Pat. No. 5,241,224 and Patel et al. U.S. Pat. No. 5,371,422 (both of which are hereby incorporated by reference herein in their entireties), may be used instead of look-up table logic.

What is claimed is:

1. Logic module circuitry for use in a programmable logic device comprising:

logic circuitry configured to perform a logic function on a plurality of input signals to produce an output signal, the logic circuitry including (1) a first portion that responds to at least a first applied signal by making a first logical contribution to the output signal in a first time after receiving the first applied signal, and (2) a second portion that responds to at least a second applied signal by making a second logical contribution to the output signal in a second time after receiving the second applied signal, the second time being less than the first time; and programmable logic connector circuitry configured to select any one of a multiplicity of the input signals as the second applied signal.

2. The logic module circuitry defined in claim 1 further comprising:

additional programmable logic connector circuitry configured to select as the first applied signal any one of the multiplicity of the input signals that is not selected as the second applied signal.

3. The logic module circuitry defined in claim 1 wherein the first and second portions are connected in series, with the first portion being upstream from the second portion so that the second portion receives at least one intermediate signal produced by the first portion and produces the output signal based on the intermediate signal and the second applied signal.

4. The logic module circuitry defined in claim 3 further comprising:

driver circuitry connected in the series between the first and second portions and configured to strengthen the intermediate signal for application to the second portion.

5. A programmable logic device comprising:

logic module circuitry as defined in claim 1;

first and second pluralities of interconnection conductors configured to convey signals to the logic module circuitry;

first programmable logic connector circuitry configured to select at least a first signal in the multiplicity of the input signals from signals on the first plurality of interconnection conductors; and second programmable logic connector circuitry configured to select at least a second signal in the multiplicity of the input signals from signals on the second plurality of interconnection conductors.

6. The programmable logic device defined in claim 5 wherein the first and second pluralities of interconnection conductors are disposed on respective opposite sides of the logic module circuitry.

7. The programmable logic device defined in claim 5 further comprising:

second logic module circuitry similar to the logic module circuitry defined in claim 1; and third programmable logic connector circuitry configured to select at least a first signal in the multiplicity of the input signals of the second logic module circuitry from signals on the second plurality of interconnection conductors so that the same signal can be selected from the second interconnection conductors as the second applied signal in both the logic module circuitry and the second logic module circuitry.

8. The programmable logic device defined in claim 7 wherein the logic module circuitry and the second logic module circuitry are disposed on respective opposite sides of the second plurality of interconnection conductors.

9. The logic module circuitry defined in claim 1 wherein the logic circuitry is further configured for programmable selection of the logic function from a plurality of possible logic functions.

10. The logic module circuitry defined in claim 9 wherein the plurality of possible logic functions includes a plurality of different logical combinations of the input signals.

11. The logic module circuitry defined in claim 1 wherein the logic circuitry comprises a plurality of data signal storage locations, wherein the first portion comprises preliminary selection circuitry configured to select a plurality of intermediate data signals from a subplurality of the storage locations based at least in part on the first applied signal, and wherein the second portion comprises final selection circuitry configured to select the output signal from the intermediate data signals based at least in part on the second applied signal.

12. The logic module circuitry defined in claim 11 wherein the logic circuitry further comprises:

driver circuitry configured to strengthen each of the intermediate data signals selected by the first portion prior to operation of the second portion on those signals.

13. The logic module circuitry defined in claim 11 wherein the logic circuitry is further configured for programmable storage of various different data signals in the storage locations.

14. A digital processing system comprising:

processing circuitry;

a memory coupled to said processing circuitry; and a programmable logic device including logic module circuitry as defined in claim 1 coupled to the processing circuitry and the memory.

15. A printed circuit board on which is mounted a programmable logic device including logic module circuitry as defined in claim 1.

16. The printed circuit board defined in claim 15 further comprising:

a memory mounted on the printed circuit board and coupled to the programmable logic device.

17. The printed circuit board defined in claim 15 further comprising:

processing circuitry mounted on the printed circuit board and coupled to the programmable logic device.

18. Logic module circuitry for use in a programmable logic device comprising:

logic circuitry configured to perform a logic function on a plurality of input signals to produce an output signal, the input signals including mutually exclusive first and second sets of the input signals, the logic circuitry including (1) a first portion that responds to the first set but not the second set of the input signals by producing at least one intermediate signal, and (2) a second portion that responds to the intermediate signal and the second set but not the first set of the input signals by producing the output signal; and driver circuitry configured to strengthen the intermediate signal produced by the first portion prior to application of the intermediate signal to the second portion.

19. Logic module circuitry for use in a programmable logic device comprising:

logic circuitry configured to perform a logic function on a plurality of input signals to produce an output signal, the logic circuitry including (1) a first portion that responds to at least a first of the input signals by producing at least one intermediate signal, and (2) a second portion that responds to the intermediate signal and at least a second of the input signals by producing the output signal, wherein the first portion additionally responds to a third of the input signals to produce the intermediate signal, and wherein the second portion additionally responds to a fourth of the input signals to produce the output signal and wherein the logic circuitry comprises a plurality of data signal storage locations, wherein the first portion comprises preliminary selection circuitry configured to select a plurality of the intermediate signals from a subplurality of the storage locations based on the first and third input signals, and wherein the second portion comprises final selection circuitry configured to select the output signal from the intermediate signals based on the second and fourth input signals; and driver circuitry configured to strengthen the intermediate signal produced by the first portion prior to application of the intermediate signal to the second portion.

20. Logic module circuitry for use in a programmable logic device comprising:

logic circuitry configured to perform a logic function on a plurality of input signals to produce an output signal, the logic circuitry including (1) a first portion that responds to at least a first of the input signals by producing at least one intermediate signal, and (2) a second portion that responds to the intermediate signal and at least a second of the input signals by producing the output signal, wherein the first portion additionally responds to a third of the input signals to produce the intermediate signal, and wherein the second portion additionally responds to a fourth of the input signals to produce the output signal;

driver circuitry configured to strengthen the intermediate signal produced by the first portion prior to application of the intermediate signal to the second portion first and second pluralities of interconnection conductors configured to convey signals to the logic module circuitry;

first programmable logic connector circuitry configured to select the first and second input signals from signals on the first plurality of interconnection conductors; and second programmable logic connector circuitry configured to select the third and fourth input signals from signals on the second plurality of interconnection conductors, wherein the first and second pluralities of interconnection conductors are disposed on respective opposite sides of the logic module circuitry.

21. The programmable logic device defined in claim 20 further comprising:

second logic module circuitry similar to the logic module circuitry defined in claim 19; and third programmable logic connector circuitry configured to select the first and second input signals of the second logic module circuitry from signals on the second plurality of interconnection conductors.

22. The programmable logic device defined in claim 21 wherein the logic module circuitry and the second logic module circuitry are disposed on respective opposite sides of the second plurality of interconnection conductors.

23. The logic module circuitry defined in claim 19 wherein the logic circuitry is further configured for programmable selection of the logic function from a plurality of logic functions.

24. The logic module circuitry defined in claim 23 wherein the plurality of logic functions includes a plurality of different logical combinations of the input signals.

25. The logic module circuitry defined in claim 19 wherein the driver circuitry is configured to strengthen each of the intermediate signals produced by the first portion prior to application of the intermediate signals to the second portion.

26. The logic module circuitry defined in claim 19 wherein the logic circuitry is further configured for programmable storage of various different data signals in the storage locations.

27. A digital processing system comprising:

processing circuitry;

a memory coupled to said processing circuitry; and a programmable logic device including logic module circuitry as defined in claim 19 coupled to the processing circuitry and the memory.

28. A printed circuit board on which is mounted a programmable logic device including logic module circuitry as defined in claim 19.

29. The printed circuit board defined in claim 28 further comprising:

a memory mounted on the printed circuit board and coupled to the programmable logic device.

30. The printed circuit board defined in claim 28 further comprising:

processing circuitry mounted on the printed circuit board and coupled to the programmable logic device.

31. Logic module circuitry for use in a programmable logic device comprising:

combinatorial logic circuitry configured to produce an intermediate signal which is any of a plurality of programmably selectable logical combinations of a plurality of input signals;

register circuitry configured to register an applied signal to produce a register output signal;

first programmable logic connector circuitry configured to select the intermediate signal or one of the input signals as the applied signal; and second programmable logic connector circuitry configured to selectively apply the register output signal to the combinatorial logic circuitry in place of said one of the input signals.

32. The logic module circuitry defined in claim 31 further comprising:

programmable inversion circuitry configured to selectively invert said one of the input signals prior to its use as the applied signal.

33. The logic module circuitry defined in claim 31 further comprising:

output circuitry configured to selectively output from the logic module both the intermediate signal and the register output signal.

34. A digital processing system comprising:

processing circuitry;

a memory coupled to said processing circuitry; and a programmable logic device including logic module circuitry as defined in claim 31 coupled to the processing circuitry and the memory.

35. A printed circuit board on which is mounted a programmable logic device including logic module circuitry as defined in claim 31.

36. The printed circuit board defined in claim 35 further comprising:

a memory mounted on the printed circuit board and coupled to the programmable logic device.

37. The printed circuit board defined in claim 35 further comprising:

processing circuitry mounted on the printed circuit board and coupled to the programmable logic device.

38. A programmable logic device comprising:

a plurality of logic module circuits, each including (1) combinatorial logic circuitry configured to produce an intermediate signal which is any of a plurality of programmably selectable logical combinations of a plurality of input signals, and (2) register circuitry configured to register an applied signal to produce a register output signal; and interconnection circuitry configured to substantially directly apply the register output signal of each logic module circuit to another logic module circuit so that the logic module circuits are connected in a series by the interconnection circuitry, each logic module circuit further including programmable logic connector circuitry configured to programmably select the intermediate signal of that logic module circuit or the register output signal applied to that logic module circuit by the interconnection circuitry as the applied signal of that logic module circuit.

39. The programmable logic device defined in claim 38 wherein each logic module circuit further includes programmable inversion circuitry configured to selectively invert the register output signal applied to that logic module circuit by the interconnection circuitry prior to use of that signal as the applied signal.

40. The programmable logic device defined in claim 38 wherein each logic module circuit further includes output circuitry configured to selectively output from the logic module both the intermediate signal and the register output signal.

41. The programmable logic device defined in claim 38 wherein each logic module circuit further includes additional programmable logic connector circuitry configured to select one of the input signals as the applied signal of that logic module circuit in lieu of selection of either of the intermediate signal or the register output signal applied by the interconnection circuitry.

42. The programmable logic device defined in claim 41 wherein each logic module circuit further includes programmable inversion circuitry configured to selectively invert said one of the input signals prior to its use as the applied signal of that logic module circuit.

43. The programmable logic device defined in claim 41 wherein each logic module circuit further includes further programmable logic connector circuitry configured to selectively apply the register output signal of that logic module circuit to the combinatorial logic circuitry of that logic module circuit in place of said one of the input signals of that logic module circuit.

44. A digital processing system comprising:

processing circuitry;

a memory coupled to said processing circuitry; and a programmable logic device as defined in claim 38 coupled to the processing circuitry and the memory.

45. A printed circuit board on which is mounted a programmable logic device as defined in claim 38.

46. The printed circuit board defined in claim 45 further comprising:

a memory mounted on the printed circuit board and coupled to the programmable logic device.

47. The printed circuit board defined in claim 45 further comprising:

processing circuitry mounted on the printed circuit board and coupled to the programmable logic device.

* * * * *